United States Patent [19]
Satoh et al.

[11] Patent Number: 4,791,273
[45] Date of Patent: Dec. 13, 1988

[54] VAPORIZER SYSTEM FOR ION SOURCE

[75] Inventors: Shu Satoh, Rowley; Louis E. Evans, Jr., Rockport, both of Mass.

[73] Assignee: Varian Associates, Inc., Palo Alto, Calif.

[21] Appl. No.: 51,076

[22] Filed: May 15, 1987

[51] Int. Cl.$^4$ .............................................. F22B 1/28
[52] U.S. Cl. ................................... 219/271; 219/272
[58] Field of Search ............... 219/271, 272, 273, 274, 219/275, 276, 339

[56] References Cited

U.S. PATENT DOCUMENTS

| | | | |
|---|---|---|---|
| 2,862,441 | 12/1958 | Schmall | 99/340 |
| 3,155,813 | 11/1964 | Morian, Jr. | 219/383 |
| 3,619,562 | 11/1971 | Jacobs | 219/348 |
| 3,869,675 | 3/1975 | Patz | 328/228 |
| 4,015,029 | 3/1977 | Elchisak | 427/76 |
| 4,328,763 | 5/1982 | Sommerkamp et al. | 219/271 |
| 4,503,087 | 3/1985 | Russo | 427/55 |
| 4,532,412 | 7/1982 | Birocchi | 219/271 |
| 4,571,486 | 2/1986 | Arai et al. | 219/339 |

*Primary Examiner*—E. A. Goldberg
*Assistant Examiner*—M. M. Lateef
*Attorney, Agent, or Firm*—Stanley Z. Cole; Terrence E. Dooher

[57] ABSTRACT

A vaporizer system for an ion source includes a radiation source positioned on the vaporizer axis for providing radiation, multiple crucibles radially spaced from the axis and circumferentially spaced from each other and a reflector rotatable about the axis for directing radiation from the source at a selected one of the crucibles. The radiation causes heating of the selected crucible and vaporization of a solid source material contained therein. The radiation source is a visible and/or infrared emitting lamp such as a quartz halogen lamp. The crucibles are thermally isolated from each other by a heat shield so that the selected crucible is heated while the others remain relatively cool.

19 Claims, 2 Drawing Sheets

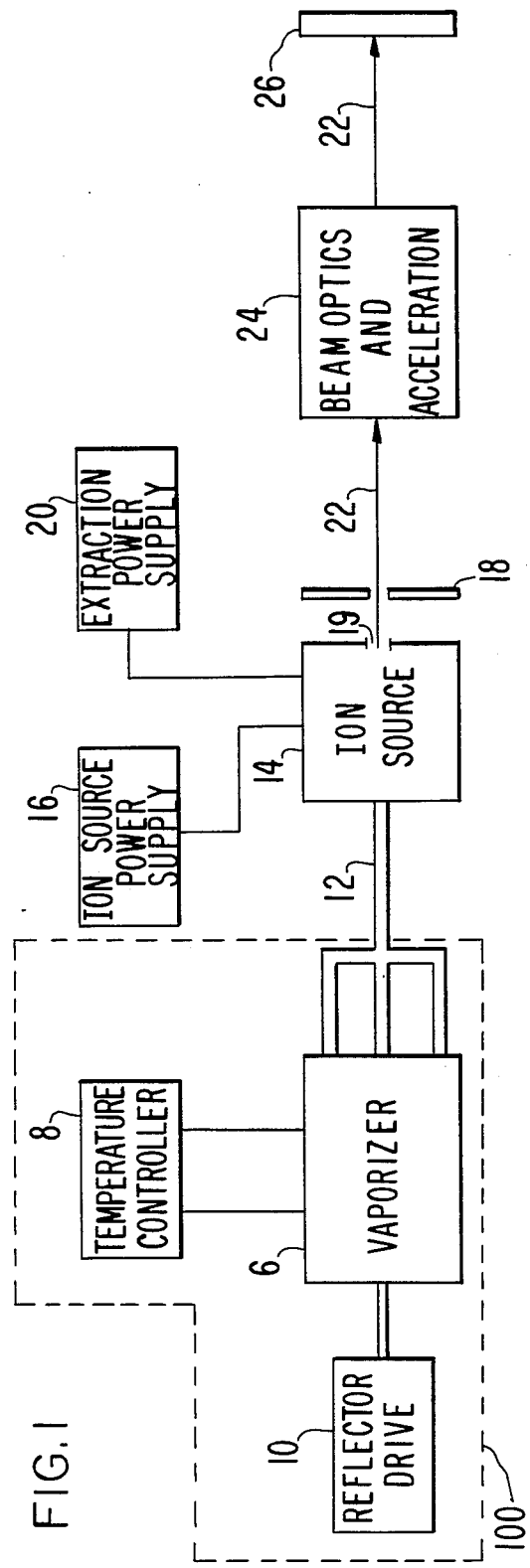
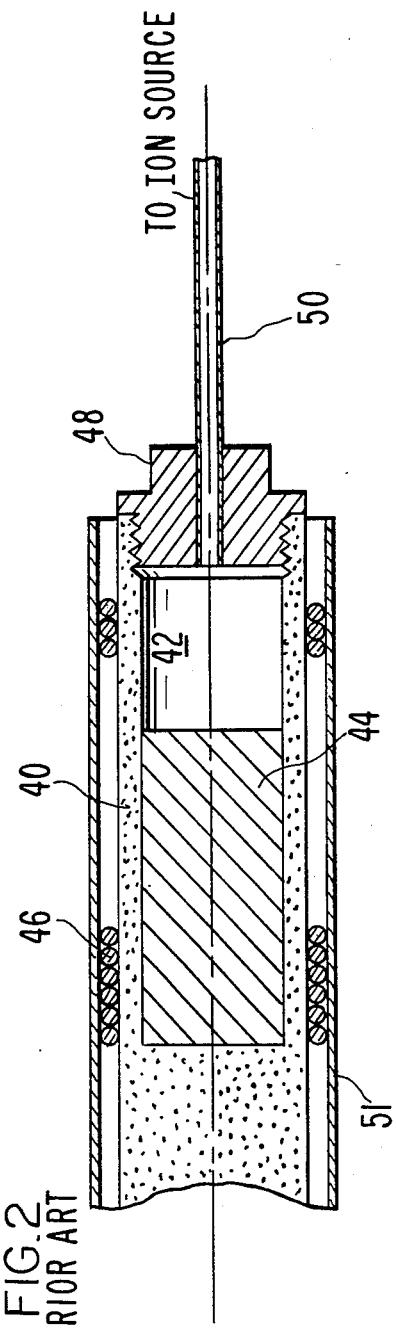
FIG. 1
FIG. 2
PRIOR ART

VAPORIZER SYSTEM FOR ION SOURCE

FIELD OF THE INVENTION

This invention relates to a vaporizer system for an ion source and, more particularly, to a vaporizer system having multiple crucibles selectively heated by radiation from a single energy source. The vaporizer system is particularly intended for use in ion implantation systems, but is not limited to such use.

BACKGROUND OF THE INVENTION

In the fabrication of integrated circuits, a number of processes have been established which involve the application of ion beams onto semiconductor wafers in vacuum. These processes include ion implantation, ion beam milling and reactive ion etching. In each instance, a beam of ions is generated in an ion source and is directed with varying degrees of acceleration toward a target. Ion implantation has become a standard technique for introducing impurities into semiconductor wafers. Impurities are introduced in the bulk of semiconductor wafers by using the momentum of energetic ions as a means of embedding them in the crystalline lattice of the semiconductor material. Ion implantation has also been used for altering the properties of metals and polymers.

The ion source for producing the ion beam includes a chamber with suitable applied electric and magnetic fields to ionize molecules of the desired species. A source material to be ionized is fed to the ion source continuously for ionization to form a continuous beam. The source material may be supplied as a gas or a solid, depending on its chemical and physical properties. When a solid material is used, it is placed in a vaporizer which heats the source material in a crucible to a temperature to produce a controlled amount of vapor of the source material. The vapor is then supplied through a conduit to the ion source for ionization. Various types of ion sources are known in the prior art.

Most prior art vaporizer systems include one crucible containing the source material, an electric heater and a thermal insulator (heat shield) to prevent heat loss and increase the efficiency of heating power. The heater and the thermal insulator are physically attached to the crucible. Other prior art systems utilize multiple crucibles, but the basic construction of each crucible remains the same. That is, each crucible has a separate electric heater physically attached to it, and the electric heaters are individually energized.

Prior art vaporizer systems have numerous disadvantages. The thermal time constant of such systems is relatively slow because of additional thermal masses of the heater and thermal insulation. The initial warm-up time and the time to change from one source material to another is relatively long because of the associated warm-up and cool-down times. Such delays are highly undesirable in a commercial ion implantation system where minimization of downtime is important. In addition, servicing of prior art heaters and crucibles is difficult since the heater and crucible are essentially inseparable. Furthermore, servicing the heater always means handling the crucible which quite often contains poisonous materials. Heater life is affected by the quality of the physical contact with the crucible. Loose contact, which always occurs to some extent, elevates the heater temperature and results in premature heater failure. Multiple crucible designs in accordance with the prior art are complicated and tend to be less reliable as the number of heaters increases. Furthermore, the number of electrical feedthroughs through the vacuum to atmosphere interface increases. All these factors tend to increase the cost of the system and reduce its reliability.

It is a general object of the present invention to provide improved vaporizer systems for ion sources.

It is another object of the present invention to provide a vaporizer system having one or more crucibles and a single radiation source which in the case of multiple crucibles is directed to a selected one of the crucibles.

It is another object of the present invention to provide a vaporizer system having a relatively short thermal time constant for heating and cooling.

It is a further object of the present invention to provide a vaporizer system which is relatively safe and which is easy to service and maintain.

It is yet another object of the present invention to provide a vaporizer system which is low in cost and which is relatively high in reliability.

SUMMARY OF THE INVENTION

According to the present invention, these and other objects and advantages are achieved in a vaporizer system comprising a vaporizer including one or more crucibles, each containing a solid source material to be vaporized and having an outlet for vapor generated therein, radiation source means for providing radiation for vaporizing the material in a selected crucible and reflector means for directing the radiation at a selected one of the crucibles to cause vaporization of the source material contained therein.

Preferably, the radiation source means comprises a visible and/or infrared source such as a quartz halogen lamp of tubular configuration. The reflector means comprises a reflecting surface movable between positions in which a substantial fraction of the radiation from the source is directed at the selected crucible. In the case of a vaporizer with a single crucible, the reflector means is fixed in such a position. The vaporizer preferably includes heat shield means positioned between each of the crucibles.

In a preferred embodiment with multiple crucibles, the radiation source means is positioned on or near an axis of the vaporizer, the crucibles are radially spaced from the axis and circumferentially spaced from each other, and the reflector means is rotatable about the axis for directing vaporizing energy at the selected crucible. The reflecting surface can have a parabolic or similar shape in a plane perpendicular to the axis so that substantially all of the radiation from the source is directed at the selected crucible. The crucibles can contain the same or different materials. The vaporizer system preferably includes means for rotating the reflecting surface between selected positions. The rotating means can include a motor or a ratchet mechanism.

In a preferred embodiment, the heat shield comprises a generally cylindrical body having cavities for mounting each of the crucibles, the radiation source means and the reflector means. The crucibles are preferably thermally isolated from the heat shield means to prevent thermal loss by conduction.

BRIEF DESCRIPTION OF THE DRAWINGS

For a better understanding of the present invention together with other and further objects, advantages and capabilities thereof, reference is made to the accompanying drawings which are incorporated herein by reference and in which:

FIG. 1 is a block diagram illustrating an ion beam system incorporating a vaporizer system in accordance with the present invention;

FIG. 2 is a cross-sectional view of a vaporizer in accordance with the prior art;

DETAILED DESCRIPTION OF THE INVENTION

Figure 3:
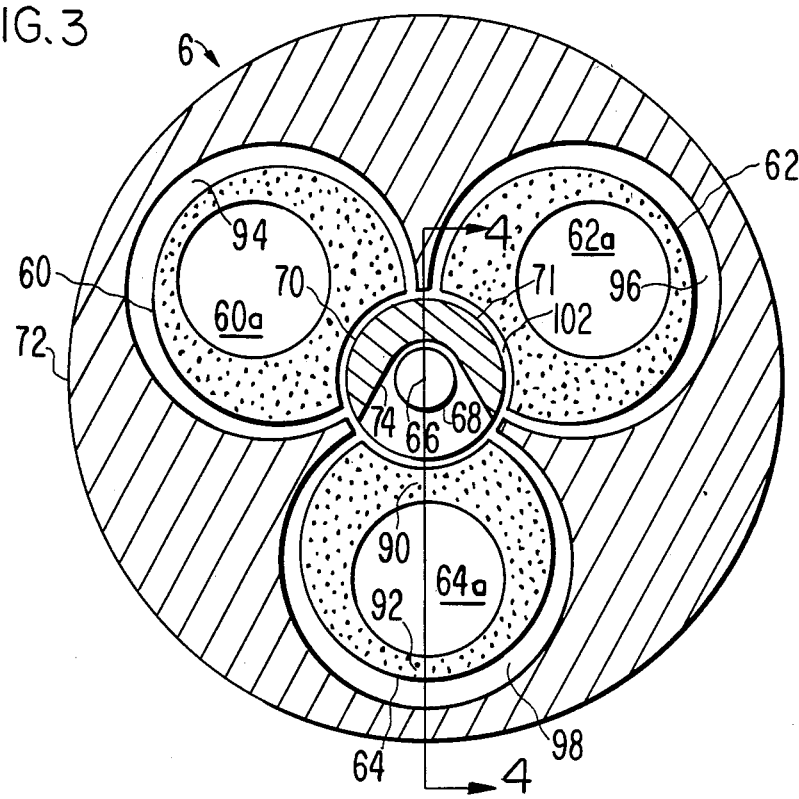
FIG. 3 is a cross-sectional view of a vaporizer in accordance with the present invention.

A block diagram of an ion beam system utilizing a vaporizer system in accordance with the present invention is shown in FIG. 1. The vaporizer system 100 includes a vaporizer 6, a temperature controller 8 and a reflector drive 10. The vaporizer 6 includes one or more crucibles for generating a vapor of a desired solid source material. One of the crucibles is energized at a given time and supplies a vapor of the source material through a conduit 12 to an ion source 14. The operation of the vaporizer system is described in detail hereinafter.

An ion source power supply 16 supplies the necessary voltages and currents to energize the ion source 14 so that the vapor supplied through the conduit 12 is ionized. An extraction power supply 20 creates a strong electric field between an exit aperture 19 in the ion source 14 and an extraction electrode 18 positioned in front of the exit aperture 19 to extract an ion beam 22 from the source 14. In the case of an ion implantation system, the ion beam 22 passes through various beam optics and acceleration elements 24 to form a high energy beam of a desired species which is directed at a target 26. The beam 22 may be scanned in one or two dimensions over the surface of target 26. Ion implantation systems are generally known in the art and are commercially available. An example of such a system is the Model 350-D available from Varian Associates, Inc., Extrion Division.

The vaporizer system of the present invention may be used in other types of ion beam systems. For example, in a reactive ion etch system, the ion source 14 produces a relatively broad ion beam and the focusing optics are omitted. A vaporizer system is utilized to supply vapor to the ion source 14 in any case where a gaseous form of the source material is not available.

A vaporizer in accordance with the prior art is illustrated in simplified form in FIG. 2. A crucible 40, usually made of graphite or boron nitride, has a cavity 42 which contains a source material 44 in solid form to be vaporized. The crucible 40 and the source material 44 are heated by an electric heater 46 wrapped around the crucible 40. A removable cover 48 seals the opening 42 and includes a tube 50 which feeds the resulting vapor from cavity 42 to the ion source. The entire crucible and heater are wrapped with a layer or more of heat shield 51.

A cross-sectional view of a vaporizer in accordance with the present invention is shown in FIG. 3. In general, the vaporizer of the invention employs one or more crucibles, each containing a source material to be vaporized; a radiation source for heating one of the crucibles at a time; and a reflector for directing energy from the radiation source at one of the crucibles. In the case of multiple crucibles, the reflector is movable so that energy from the radiation source can be directed at a selected crucible. One of the crucibles is heated by the radiation source, while the others remain relatively cool. The difficulties associated with turning individual heaters on and off are eliminated.

Crucibles 60, 62 and 64 are equiangularly spaced about a central axis 66 (perpendicular to the paper in FIG. 3). A radiation source comprising a visible and/or infrared emitting lamp 68 is mounted on or near the axis 66. A reflector 70, which is rotatable about the axis 66, directs lamp radiation that otherwise would impinge on all the crucibles to a selected one of the crucibles 60, 62, 64. A generally cylindrical heat shield 72 provides thermal isolation between crucibles 60, 62, 64 so that the selected crucible can be raised to a high temperature by radiation from lamp 68, while the nonselected crucibles remain relatively cool. A back surface 71 of the reflector 70 can be finished in such a way (for example, black anodizing) that its thermal radiation absorption properties are enhanced, allowing it to act as a radiation heat sink to those crucibles other than the one selected to be heated. The reflector 70 can be water cooled at its end (not shown) to remove heat absorbed by the reflector.

The radiation source for heating the crucibles 60, 62, 64 is preferably a visible and/or infrared source. One suitable lamp is a quartz halogen lamp such as a Type QH500 T3 manufactured by GTE, Sylvania and having a rating of 500 W. The lamp 68 has a tubular envelope and is mounted with its axis parallel to the axis 66 of the vaporizer system. A temperature controller 8 (FIG. 1) supplies electric power to lamp 68 in a controlled amount to increase the temperature of the selected crucible as quickly as possible during the warm-up period and to maintain the temperature of the selected crucible as stable as possible during the vaporization period so as to feed a constant flow of vapor to the ion source. It will be understood that other radiation sources and wavelengths other than infrared are included within the scope of the present invention.

The reflector 70 is fabricated from a metal such as aluminum which has good thermal conductivity and high reflectance to the spectrum of the light emitted by the lamp 68. The reflector 70 includes a reflecting surface 74 on the side which faces the lamp 68 and absorbing surface 71 on the opposite side. The reflector 70 has a cross-section as shown in FIG. 3 which is axially uniform and extends along the length of lamp 68 so that substantially all of the radiation from lamp 68 is directed toward the selected crucible. The reflecting surface 74 can have any suitable shape for reflecting radiation from lamp 68 toward the selected crucible. One preferred shape is parabolic with the focus of the parabola coincident with the axis of the lamp. As noted previously, the reflector 70 is rotatable about axis 66 to positions in which it faces each of the crucibles 60, 62, 64. It can be manually moved between positions, but is preferably moved by reflector drive 10 (FIG. 1) a vaporizer system 100 which can be controlled by a system computer or other system controller. The reflector drive 10 can be a motor or ratchet type mechanism.

Each of the crucibles 60, 62, 64 has the form of a generally cylindical container with a cavity 60a, 62a, 64a, respectively, in which a source material 82 (FIG. 4) is placed. Each of the cavities 60a, 62a, 64a is sealed by a removable cover 84 having a tube or conduit 86 passing through it. The conduit 86 directs vapor from the respective cavity to the ion source.

Figure 4:
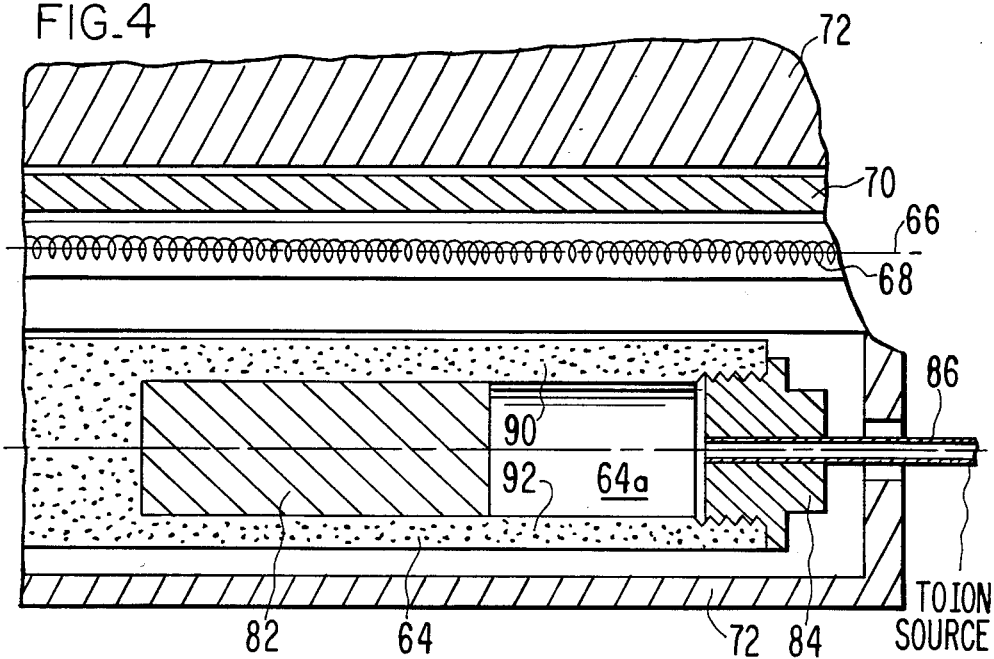
FIG. 4 is a partial cross-sectional view of the vaporizer taken through the line 4—4 of FIG. 3.

Cavities 60a, 62a, 64a can be centrally located in the respective crucibles. In a preferred embodiment, however, the cavities are off-center so that a portion 90 of the crucible side wall closest to the axis 66 is thicker than a portion 92 of the crucible side wall remote from the axis 66, as shown in FIGS. 3 and 4. The variable wall thickness to some extent compensates for the fact that the radiation from lamp 68 is applied unevenly to one side of each of the crucibles. The variable wall thickness tends to more evenly distribute the heat supplied to the source material 82 contained in the cavities 60a, 62a, 64a. With reference to FIG. 3, the crucibles 60, 62, 64 each include an arc-shaped cutout in the portion which faces the lamp 68 to accommodate rotation of the reflector 70. This configuration permits the crucibles to be positioned in close proximity to the lamp 68 while permitting the reflector 70 to rotate freely between positions.

In another preferred embodiment (not shown), a thin walled crucible is located in such a position, and reflectors 72 is shaped in such a way, as to provide uniform or nearly uniform heating over the surface of the crucible, resulting in a system with less thermal mass, which is turn helps to reduce warm-up and cool-down time further.

The embodiment illustrated in FIG. 3 includes three crucibles 60, 62, 64 having equal radial spacings from axis 66 and equiangularly spaced from each other. It will be understood that the vaporizer system of the present invention can include one or more crucibles spaced arond the radiation source with the number of crucibles depending on the application. The crucibles are preferably fabricated from graphite which has good chemical compatibilities to many materials to be vaporized, good thermal conductivity and good absorbing characteristics (emittance) to the spectrum of light emitted by lamp 68.

The vaporizer system of the present invention further includes the heat shield 72 which is preferably fabricated from aluminum because of its high reflectance to visible and/or infrared radiation and its high thermal conductivity. The heat shield 72 is generally cylindrical in overall shape and includes cavities 94, 96, 98 for crucibles 60, 62, 64, respectively, and a centrally located cavity 102 which contains the reflector 70 and the lamp 68. Heat shield 72, which can be water cooled at its end (not shown), provides thermal shielding between the crucibles 60, 62, 64 so that one of the crucibles can be heated while the other two remain relatively cool. Preferably, the crucibles 60, 62, 64 are spaced from the heat shield 72 to prevent thermal conduction from the crucibles 60, 62, 64 to the heat shield 72. The crucibles 60, 62, 64 are supported in cavities 94, 96, 98, respectively, by conventional end mounting means.

In an ion implantation application, the crucibles 60, 62, 64 can contain arsenic, phosphorous and antimony, respectively. In the vaporizer system of the invention, a selected source material can be vaporized rapidly, and the system can be brought to an operating condition rapidly. Virtually no vapor is obtained from the unheated crucibles. Similarly, changes between species can be accomplished rapidly with minimum downtime.

The present invention provides the capability to easily change the number of crucibles in a system without changing the number of heat sources by simply changing the illumination angle of the reflector. The heat source is a separate part of the system. The heat source can be serviced without touching any of the crucibles which may contain poisonous material. The crucible itself can be less expensive and easily replaced because of the lack of a dedicated heater and cumbersome electrical connections.

While there has been shown and described what is at present considered the preferred embodiments of the present invention, it will be obvious to those skilled in the art that various changes and modifications may be made therein without departing from the scope of the invention as defined by the appended claims.

What is claimed is:

1. A vaporizer comprising:
    at least two crucibles each having a cavity for containing a solid source material to be vaporized and having an outlet for vapor generated in said cavity;
    radiation source means for providing radiation for heating a selected crucible and vaporizing a source material in said cavity of said selected crucible; and
    movable reflector means having a first position for reflecting radiation from said radiation source means toward a first selected one of said crucibles vaporization of the source material contained and a second position for reflecting radiation from said radiation source means toward a second selected one of said crucibles.

2. A vaporizer as defined in claim 1 wherein said radiation source means comprises a radiation source which emits radiation in a spectrum selected from infrared, visible or a combination thereof.

3. A vaporizer as defined in claim 1 wherein said reflector means includes a thermal radiation absorbing back surface to facilitate cooling of nonselected crucibles.

4. A vaporizer as defined in claim 1 wherein said radiation source means comprises a quartz lamp.

5. A vaporizer as defined in claim 1 wherein said movable reflector means comprises a reflecting surface movable between said first and said second positions, a substantial fraction of the radiation from said radiation source means being directed toward said first crucible when said reflecting surface is in said first position and a substantial fraction of the radiation from said radiation source being directed toward said second selected crucible when said reflecting surface is in said second position.

6. A vaporizer as defined in claim 5 further including heat shield means positioned between said at least two crucibles.

7. A vaporizer system comprising:
    radiation source means positioned on an axis for providing radiation;
    at least two crucibles radially spaced from said axis and circumferentially spaced from each other, said crucibles each having a cavity for containing a solid source material;
    reflector means rotatable about said axis from a first position for reflecting radiation from said radiation source means toward a first selected one of said at least two crucibles for causing vaporization of a source material contained in said cavity of said first selected crucible to a second position for reflecting radiation from said source means toward a second selected crucible of said at least two crucibles for causing vaporization of a source material contained in said cavity of said second selected crucible.

8. A vaporizer system as defined in claim 7 wherein said radiation source means comprises a radiation source which emits radiation in a spectrum selected from infrared, visible or a combination thereof.

9. A vaporizer system as defined in claim 7 wherein said radiation source means comprises a tubular quartz halogen lamp parallel to the axis.

10. A vaporizer system as defined in claim 9 wherein said rotatable reflector means comprises a reflecting surface movable between a plurality of position including a first position for directing a substantial fraction of the radiation from said radiation source means toward said first selected one of said crucibles and a second position for directing a substantial fraction of said radiation toward said second selected one of said crucibles.

11. A vaporizer system as defined in claim 10 wherein said reflecting surface has a parabolic shape in a plane perpendicular to said axis, said parabolic shape having a focal point coincident with the axis of said lamp.

12. A vaporizer system as defined in claim 7 wherein said reflector means includes a thermal radiation absorbing back surface to facilitate cooling of nonselected crucibles.

13. A vaporizer system as defined in claim 7 wherein said at least two crucibles comprise three crucibles spaced apart by 120 degrees around said axis.

14. A vaporizer system as defined in claim 10 further including means for rotating said reflecting surface between said first position and said second position.

15. A vaporizer system a defined in claim 7 wherein each crucible comprises a container having a side wall and wherein a portion of the side wall closest to said axis is thicker than a portion of said side wall remote from said axis to promote uniform delivery of heat to a source material to be placed in said crucible.

16. A vaporizer system as defined in claim 7 further including heat shield means positioned between said at least two crucibles.

17. A vaporizer system as defined in claim 16 wherein said crucibles are thermally isolated from said heat shield means to prevent thermal loss from said crucibles by conduction.

18. A vaporizer system as defined in claim 17 wherein said heat shield means comprises a generally cylindrical body having cavities for mounting said at east two crucibles, said radiation source means and said reflector means.

19. A vaporizer comprising:
a crucible having a cavity for containing a solid source material to be vaporized and having an outlet for vapor generated in said cavity;
radiation source means for providing radiation for heating the crucible and for vaporizing a source material to be placed in said cavity; and
reflector means for reflecting radiation from said radiation source means toward said crucible to cause vaporization of a source material to be contained in said cavity,
said crucible comprising a container having a side wall wherein a portion of the side wall closest to said radiation source means is thicker than a portion of the side wall remote from said radiation source means in order to promote uniform delivery of heat to a source material in said cavity.

* * * * *